(12) United States Patent
Lee et al.

(10) Patent No.: US 8,766,851 B2
(45) Date of Patent: Jul. 1, 2014

(54) BUTLER MATRIX AND MULTI-PORT AMPLIFIER HAVING THE SAME

(75) Inventors: Hong-Yeol Lee, Cheongju-si (KR);
Man-Seok Uhm, Daejeon-si (KR);
So-Hyeun Yun, Daejeon-si (KR);
In-Bok Yom, Daejeon-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 329 days.

(21) Appl. No.: 13/288,486

(22) Filed: Nov. 3, 2011

(65) Prior Publication Data

US 2012/0112963 A1    May 10, 2012

(30) Foreign Application Priority Data

Nov. 8, 2010 (KR) .................. 10-2010-0110459

(51) Int. Cl.
*H01Q 3/00* (2006.01)
*H01P 5/12* (2006.01)
*H01Q 3/40* (2006.01)
*H03F 3/60* (2006.01)

(52) U.S. Cl.
CPC ............ *H01P 5/12* (2013.01); *H03F 2200/204* (2013.01); *H03F 2200/192* (2013.01); *H01Q 3/40* (2013.01); *H03F 3/60* (2013.01)
USPC ........................................................ 342/373

(58) Field of Classification Search
USPC ....................................................... 342/373
See application file for complete search history.

(56) References Cited

U.S. PATENT DOCUMENTS

| 4,812,788 A | 3/1989 | Wong et al. |
| 8,013,784 B2 * | 9/2011 | Margomenos et al. ....... 342/175 |

FOREIGN PATENT DOCUMENTS

| EP | 0 315 064 | 10/1988 |
| GB | 2257842 A | 1/1993 |
| JP | 6-216612 | 8/1994 |

OTHER PUBLICATIONS

Jacob Remez & Roi Carmon, Compact Designs of Waveguide Butler Matrices (IEEE Antennas and Wireless Propagation Letters, vol. 5, 2006).
Piovano, Accatino, Muoio, Caille, Mongiardo, Cad and Mechanical Realization of Planar, Ka-Band, 8x8 Butler Matrices (Telecom Italia Lab (formerly CSELT) via Reiss Romoli, 274-10148 Torino, Italy).
M. Saitoh et al., "A Broadband Waveguide Monopulse Comparator with Phase Compensation Circuits", Proceedings of ISAP2005,Seoul, Korea, 2005, pp. 833-836.
M. Mohammadi, et al., "Planar Eight Port Waveguide Mono-Pulse Comparator," Progress in Electromagnetics Research C, vol. 6, pp. 103-113, 2009.

* cited by examiner

*Primary Examiner* — Harry Liu
(74) *Attorney, Agent, or Firm* — Staas & Halsey LLP

(57) ABSTRACT

A butler matrix and a multi-port amplifier having the same, capable of splitting a single input signal into N-signals or combining N-signals into a single output are provided. The hybrids are provided in a predetermined disposition, the input port and the output port of the hybrids are provided in a predetermined direction and the waveguides are provided in a bended structure such that paths for connecting the hybrids have no crossing portion.

20 Claims, 7 Drawing Sheets

BUTLER MATRIX AND MULTI-PORT AMPLIFIER HAVING THE SAME

CROSS-REFERENCE TO RELATED APPLICATION

This application claims the benefit under 35 U.S.C. §119(a) of Korean Patent Application No. 10-2010-0110459, filed on Nov. 8, 2010, the disclosure of which is incorporated by reference in its entirety for all purposes.

BACKGROUND

1. Field

The following description relates to a butler matrix and a multi-port amplifier having the same, capable of splitting a single input signal into N-signals or combining N-signals into a single output.

2. Description of the Related Art

A multi-port amplifier uses a butler matrix as a passive device for splitting a single input signal into a plurality of signals (N) or combining a plurality of signals (N) into a single output. The butler matrix may use a micro-strip line, a strip line, a coaxial line or a waveguide selected according to the magnitude of a transmission signal. For a multi-port amplifier designed for a high power operation, a butler matrix is formed using a waveguide.

The butler matrix is implemented using a 3 dB hybrid having four ports for splitting and combining the power of signals. A 2×2 matrix uses one dB hybrid, a 4×4 matrix uses four hybrids and a 8×8 matrix uses twelve hybrids. The more input/output ports require the more hybrids and increase in complexity of the paths used to connect the hybrids to each other, resulting in a short circuit portion where the transmission lines cross each other. Accordingly, the butler matrix needs to have a design capable of preventing a short circuit caused by the crossing of transmission lines.

When the butler matrix is implemented using a planar type line including a microstrip line or a strip line that are stacked on top of each other, a via hole is used for isolating transmission lines. When the butler matrix is formed using a coaxial line or a waveguide having a limitation to implementing in a planar type, a bended transmission line is used to isolate transmission lines.

When the butler matrix uses a via hole that is formed through planer type lines stacked on top of each other, electrical parasitic components are created and this causes a distortion of signals and has a difficulty in using a high power. When the butler matrix uses a bended coaxial line or waveguide, a path loss is caused by the complicating structure of paths. If a crossover is formed at a crossing of lines by connecting two 3 dB hybrids to each other, the butler matrix is implemented as a planar type but this causes a phase difference as compared with a butler matrix using no crossover.

FIG. 1 is a block diagram showing a conventional 8×8 butler matrix. As shown in FIG. 1, the 8×8 butler matrix uses twelve 3 dB hybrids including a first hybrid to a twelfth hybrid H1, H2, H3, H4, H5, H6, H7, H8, H9, H10, H11 and H12 and includes transmission lines L15, L16, L25, L26, L37, L38, L47, L48, L59, L79, L510, L611, L612, L710, L811 and L812 to achieve interconnection among the first to twelfth hybrids H1 to H12. The signal flow of the 8×8 butler matrix is as follows.

An input signal is fed to one of input ports of the first hybrid H1. The fed input signal is split into two outputs having a half reduced magnitude and a 90 degree phase shift, and output through two output ports of the first hybrid H1.

The signals output from the first hybrid H1 are fed to the fifth hybrid H5 and the sixth hybrid H6, respectively. Each signal fed to the fifth hybrid H5 and the sixth hybrid H6 is split into two outputs as above described scheme, and output through two output ports of each of the fifth hybrid H5 and the sixth hybrid H6. The signals output from the fifth hybrid H5 and the sixth hybrid H6 are fed to the ninth hybrid H9, the tenth hybrid H10, the eleventh hybrid H11 and the twelfth hybrid H12. Each signal fed to the ninth hybrid H9, the tenth hybrid H10, the eleventh hybrid H11 and the twelfth hybrid H12 is split to two outputs for each of the ninth hybrid H9 to the twelfth hybrid H12 such that eight outputs are output through eight output ports of the ninth hybrid H9 to the twelfth hybrid H12. In this manner, when it is assumed that a path loss and a phase difference are not present, an input is divided into outputs each having a power level which is reduced by −9 dB as compared with the input power level.

However, among each transmission line connecting the first hybrid to the twelfth hybrid H1 to H12, there are crossings between the transmission lines L16 and L25, between the transmission lines L38 and L47, between the transmission lines L510 and L79, between the transmission lines L611 and L79 or L710, and between the transmission lines L612 and L79 or L710 or L811.

In order to prevent a short circuit due to the crossings among the transmission lines, the butler matrix may be implemented in a three dimensional structure by connecting waveguide lines in a bended structure, or may be implemented in a two dimensional structure by use of a crossover coupler at a crossing portion.

There is a need that an output of a butler matrix has the same amplitude and a constant phase difference relative to an input signal. In this regard, the transmission lines connecting the hybrids need to be designed to have the same transmission length, or the amplitude and phase needs to be adjusted according to the resultant change. In addition, a bended waveguide may increase in complexity of the paths.

In addition, if a crossover coupler is used at a crossing portion, a change in amplitude and phase is made at the crossing portion, so the changed amplitude needs to be adjusted by use of an amplitude attenuator or an active device having a gain, or the changed phase needs to be adjusted by use of a phase shifter.

SUMMARY

In one aspect, there is provided a butler matrix and a multi-port amplifier having the same, capable of removing signal loss or distortions by isolating crossing paths without using a via hole, a complicating line structure or a crossover.

In one general aspect, there is provided a butler matrix. The butler matrix includes a plurality of hybrids and waveguides. Each of the hybrids is provided at one side thereof with an input port and at an opposite side thereof with an output port. The waveguides are configured to connect the hybrids to transmit a signal among the hybrids. The hybrids are provided in a predetermined disposition, the input port and the output port of the hybrids are provided in a predetermined direction and the waveguides are provided in a bended structure such that paths for connecting the hybrids have no crossing portion.

Other features will become apparent to those skilled in the art from the following detailed description, which, taken in conjunction with the attached drawings, discloses exemplary embodiments of the invention.

BRIEF DESCRIPTION OF THE DRAWINGS

Elements, features, and structures are denoted by the same reference numerals throughout the drawings and the detailed description, and the size and proportions of some elements may be exaggerated in the drawings for clarity and convenience.

DETAILED DESCRIPTION

The following detailed description is provided to assist the reader in gaining a comprehensive understanding of the methods, apparatuses and/or systems described herein. Various changes, modifications, and equivalents of the systems, apparatuses and/or methods described herein will suggest themselves to those of ordinary skill in the art. Descriptions of well-known functions and structures are omitted to enhance clarity and conciseness.

Hereinafter, examples of the present invention will be described with reference to accompanying drawings in detail.

Figure 1:
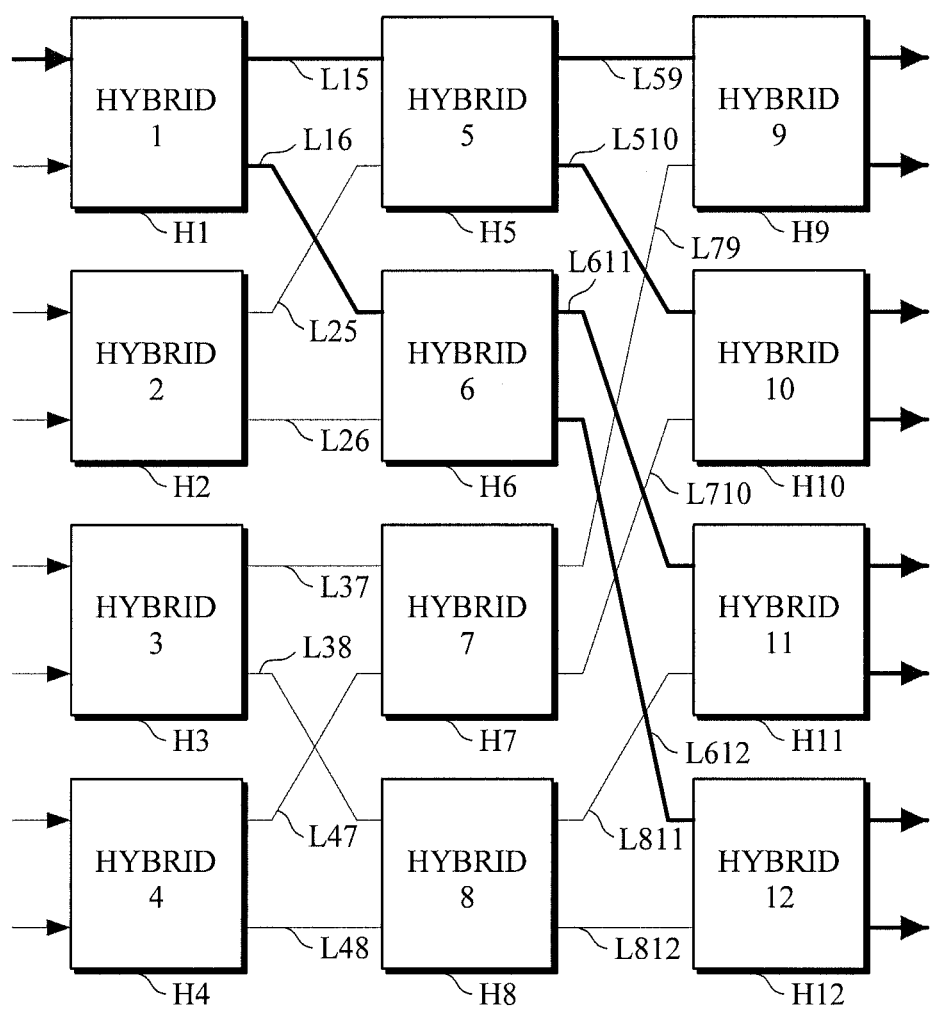
FIG. 1 is a block diagram showing a conventional 8×8 butler matrix.
Figure 2:
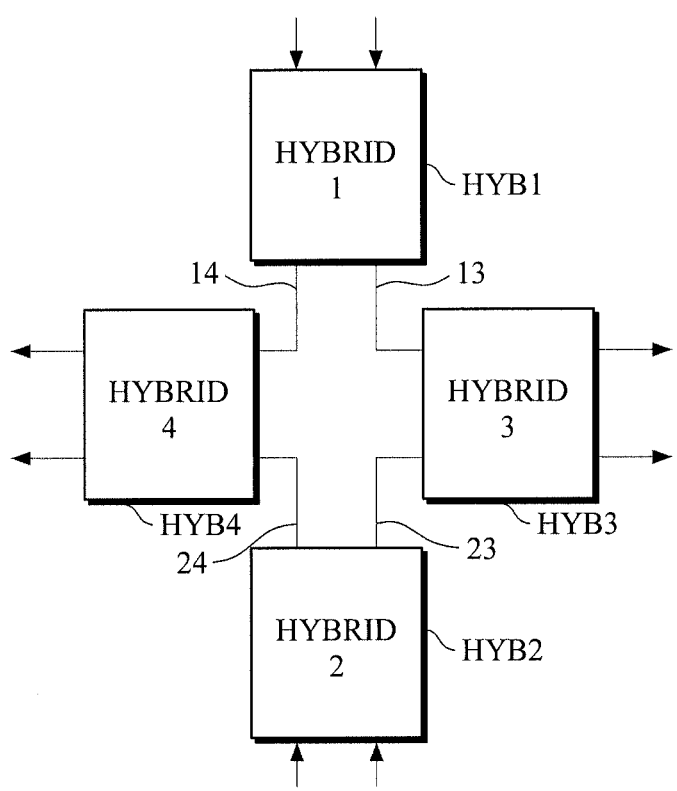
FIG. 2 is a block diagram showing an example of a 4×4 butler matrix.
Figure 3:
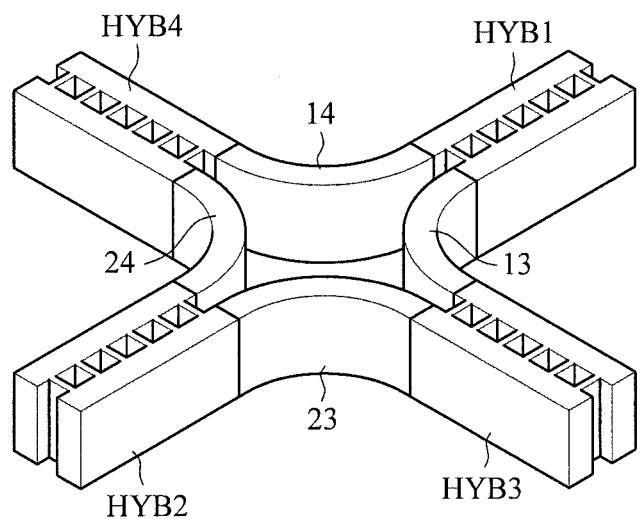
FIG. 3 is a perspective view showing the 4×4 butler matrix of FIG. 2.

FIG. 2 is a block diagram showing an example of a 4×4 butler matrix. FIG. 3 is a perspective view showing the 4×4 butler matrix of FIG. 2. FIG. 3 illustrates hybrids and some portion of waveguides filled with air except for conductive bodies of the waveguides and hybrids.

As shown in FIGS. 2 and 3, a 4×4 butler matrix includes first to fourth hybrids HYB1 to HYB4, and waveguides 13, 14, 23 and 24. Each of the first to fourth hybrids HYB1 to HYB4 is provided at one side thereof with an input port and at an opposite side thereof with an output port.

The waveguides 13, 14, 23 and 24 are configured to connect the first to fourth hybrids HYB1 to HYB4 to transmit signals among the first to fourth hybrids HYB1 to HYB4. The first to fourth hybrids HYB1 to HYB4 are provided in a predetermined disposition, the input port and the output port of the first to fourth hybrids HYB1 to HYB4 are provided in a predetermined direction, and the waveguides 13, 14, 23 and 24 are provided in a bended structure such that paths for connecting the hybrids have no crossing portion. Accordingly, the butler matrix is implemented without a via hole, a complicating line or a crossover, so that the path loss and the phase change are minimized.

Each of the first to fourth hybrids HYB1 to HYB4 may be a four port hybrid having two input ports and two output ports. Each of the first to fourth hybrids HYB1 to HYB4 may be a 3 dB hybrid that produces a power level which is reduced as 3 dB relative to input power level. Each of the first to fourth hybrids HYB1 to HYB4 may be a binomial slot hybrid having an E-plane shape capable of obtaining characteristics of a wide bandwidth.

The first to fourth hybrids HYB1 to HYB4 are arranged in a radial shape on the same plane and include one pair of facing hybrids HYB1 and HYB2 each have input ports directed outward and another pair of facing hybrids HYB3 and HYB4 each have output ports directed outward. The two input terminals of each of the first to fourth hybrids HYB1 to HYB4 are laterally disposed and the two output terminals of each of the first to fourth hybrids HYB1 to HYB4 are laterally disposed.

The four waveguides 13, 14, 23 and 24 have an identical transmission length and connect the first to fourth hybrids HYB1 to HYB4 to each other. The four waveguides 13, 14, 23 and 24 have the same size and bended shape. The four waveguides 13, 14, 23 and 24 are disposed between the first hybrid HYB1 and the third hybrid HYB3, between the first hybrid HYB1 and the fourth hybrid HYB4, between the second hybrid HYB2 and the third hybrid HYB3 and between the second hybrid HYB2 and the fourth hybrid HYB4, respectively. In a state that the waveguides 13, 14, 23 and 24 are bended inward and each center portion of the waveguides 13, 14, 23 and 24 face each other, two opposite ends of the waveguide 13 are connected to the first hybrid HYB1 and the third hybrid HYB3, respectively, two opposite ends of the waveguide 14 are connected to the first hybrid HYB1 and the fourth hybrid HYB4, respectively, two opposite ends of the waveguide 23 are connected to the second hybrid HYB2 and the third hybrid HYB3, respectively, and two opposite ends of the waveguide 24 are connected to the second hybrid HYB2 and the fourth hybrid HYB4, respectively.

One end of the waveguide 13 is connected to an output port of the first hybrid HYB1 and another end of the waveguide 13 is connected to an input port of the third hybrid HYB3. One end of the waveguide 14 is connected to another output port of the first hybrid HYB1 and another end of the waveguide 14 is connected to an input port of the fourth hybrid HYB4. One end of the waveguide 23 is connected to an output port of the second hybrid HYB2 and another end of the waveguide 23 is connected to another input port of the third hybrid HYB3. One end of the waveguide 24 is connected to another output port of the second hybrid HYB2 and another end of the waveguide 24 is connected to another input port of the fourth hybrid HYB4.

The waveguides 13, 24, 23 and 24 may be formed using an E-plane waveguide. Accordingly, the above described butler matrix has a simple path, and produces an output having the same amplitude and a constant phase difference relative to the input.

Figure 4:
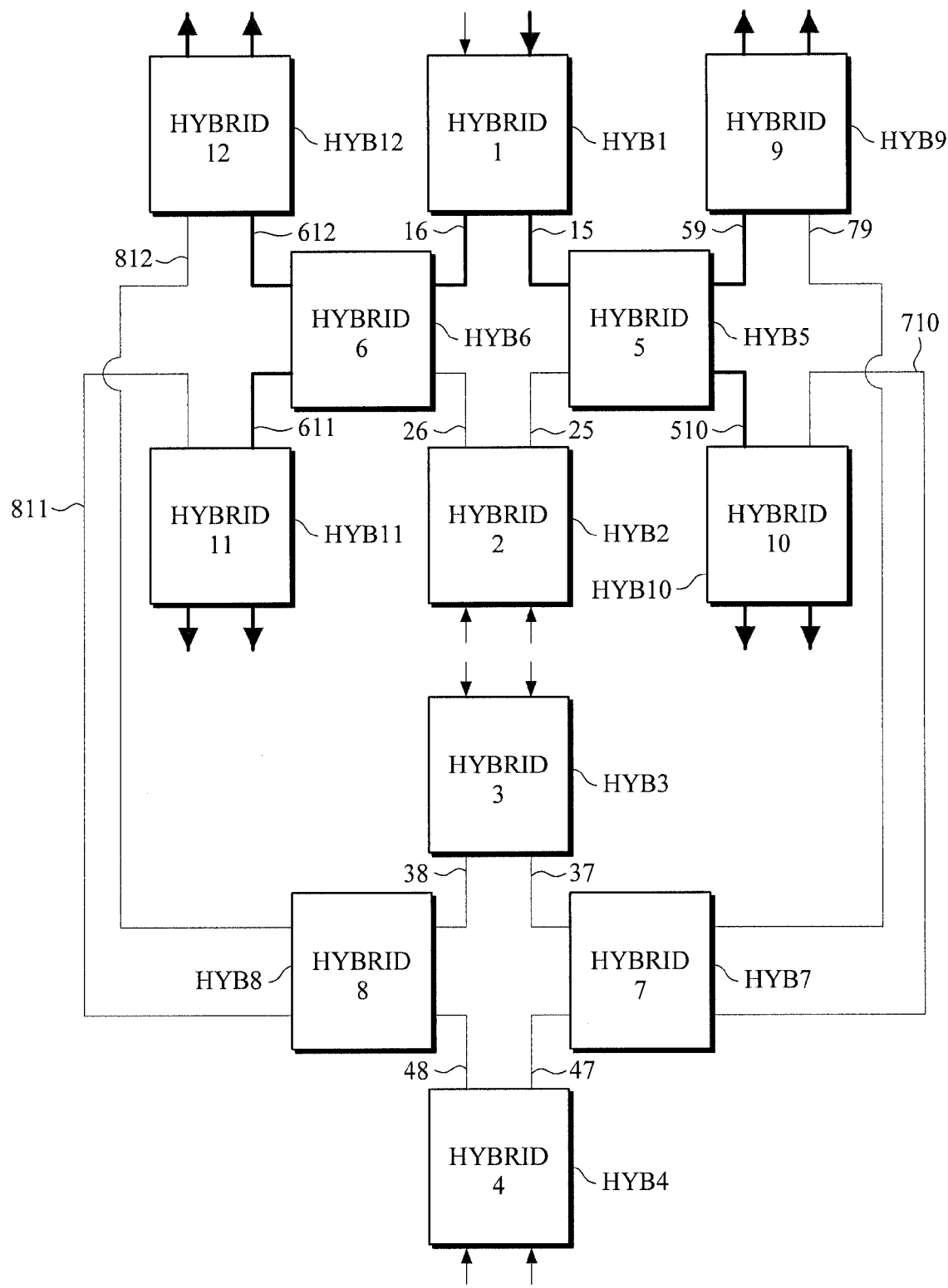
FIG. 4 is a block diagram showing an example of a 8×8 butler matrix.
Figure 5:
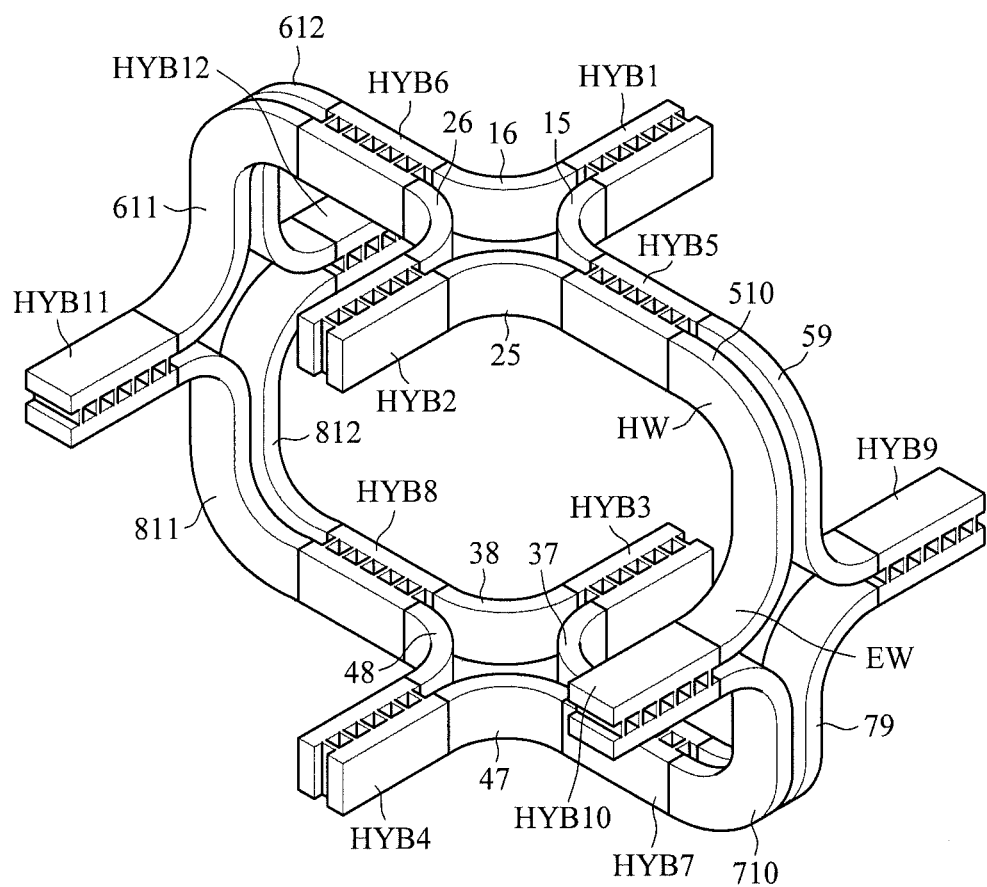
FIG. 5 is a perspective view showing the 8×8 butler matrix of FIG. 4.

FIG. 4 is a block diagram showing an example of a 8×8 butler matrix. FIG. 5 is a perspective view showing the 8×8 butler matrix of FIG. 4.

As shown in FIGS. 4 and 5, the 8×8 butler matrix is provided in a three dimensional structure. The 8×8 butler matrix includes twelve hybrids, including the first hybrid to twelfth hybrid HYB1 to HYB12, and waveguides 15, 16, 25, 26, 37, 38, 47, 48, 59, 79, 510, 611, 612, 710, 811 and 812. Each of the first hybrid to twelfth hybrid HYB1 to HYB12 may be a four port hybrid having two input ports and two output ports.

Each of the first hybrid to twelfth hybrid HYB1 to HYB12 may be a 3 dB hybrid that produces a power level which is reduced as 3 dB relative to input power level. Each of the first hybrid to twelfth hybrid HYB1 to HYB12 may be a binomial slot hybrid having an E-plane shape capable of obtaining characteristics of a wide bandwidth. The first hybrid to twelfth hybrid HYB1 to HYB12 includes a first hybrid array, a second hybrid array and a third hybrid array each including four hybrids.

Four hybrids HYB1, HYB2, HYB5 and HYB6 of the twelve hybrids forming the first hybrid array are arranged in a radial shape on the same plane and include one pair of facing hybrids HYB1 and HYB2 each having input ports directed outward and another pair of facing hybrids HYB5 and HYB6 each having output ports directed outward. Four hybrids HYB3, HYB4, HYB7 and HYB8 of the twelve hybrids forming the second hybrid array are disposed at a lower part of the first hybrid array in the identical shape of the first hybrid array.

Four hybrids HYB9, HYB10, HYB11 and HYB12 of the twelve hybrids forming the third hybrid array are disposed between the first hybrid array and the second hybrid array. The four hybrids HYB9, HYB10, HYB11 and HYB12 are disposed in parallel to the hybrids HYB1, HYB2, HYB3, and HYB4 of the first and second hybrid arrays while having output ports directed outward. The two input ports of the four hybrids HYB9, HYB10, HYB11 and HYB12 are vertically disposed and the two output ports of the four hybrids HYB9, HYB10, HYB11 and HYB12 are vertically disposed.

The waveguides 15, 16, 25, 26, 37, 38, 47, 48, 59, 79, 510, 611, 612, 710, 811 and 812 includes first waveguides 15, 16, 25, 26, 37, 38, 47 and 48 and second waveguides 59, 79, 510, 611, 612, 710, 811 and 812. Four of the first waveguides 15, 16, 25 and 26 connect the hybrid HYB1 to the hybrid HYB5, the hybrid HYB1 to the hybrid HYB6, the hybrid HYB2 to the hybrid HYB5 and the hybrid HYB2 to the hybrid HYB6, respectively. Four of the first waveguides 37, 38, 47 and 48 connect the hybrid HYB3 to the hybrid HYB7, the hybrid HYB3 to the hybrid HYB8, the hybrid HYB4 to the hybrid HYB7 and the hybrid HYB4 to the hybrid HYB8, respectively The first waveguides 15, 16, 25 and 26 achieves a connection among the hybrids HYB1, HYB2, HYB5 and HYB6 of the first hybrid array, and the first waveguides 37, 38, 47 and 48 achieves a connection among the hybrids HYB3, HYB4, HYB7 and HYB8 of the second hybrid array in the same manner of connecting the hybrids HYB1, HYB2, HYB3 and HYB4 through the waveguides 13, 14, 23 and 24 as shown in FIG. 4.

The first waveguides 15, 16, 25, 26, 37, 38, 47 and 48 have the same transmission length and achieve a connection among the hybrids HYB1, HYB2, HYB5 and HYB6 and a connection among the hybrids HYB3, HYB4, HYB7 and HYB8.

Four of the second waveguides 59, 510, 611 and 612 connect the hybrid HYB5 to the hybrid HYB9, the hybrid HYB5 to the hybrid HYB10, the hybrid HYB6 to the hybrid HYB11 and the hybrid HYB6 to the hybrid HYB12, respectively. Four of the second waveguides 79, 710, 811 and 812 connect the hybrid HYB7 to the hybrid HYB9, the hybrid HYB7 to the hybrid HYB10, the hybrid HYB8 to the hybrid HYB11 and the hybrid HYB8 to the hybrid HYB12, respectively.

The second waveguides 59, 79, 510, 611, 612, 710, 811 and 812 have the same transmission length. Each of the second waveguides 59, 79, 510, 611, 612, 710, 811 and 812 is implemented in a form including an E-plane waveguide and an H-plane waveguide that are connected to each other. The E-plane is formed perpendicular to the H-plane. Accordingly, each of the second waveguides 59, 79, 510, 611, 612, 710, 811 and 812 is bended at a connection portion between the E-plane waveguide and the H-plane waveguide by 90 degrees twist.

The H-plane waveguide (HW) is connected to the first hybrid array or the second hybrid array, and the E-plane waveguide (EW) is connected to the third hybrid array. Accordingly, the above described butler matrix has a simple path, and produces an output having the same amplitude and a constant phase difference relative to the input.

The above described butler matrixes may be applicable to a multi-port amplifier. For example, an amplifier may be connected among many of the above butler matrixes. An output terminal of one of the butler matrixes is connected to an input port of the amplifier and an input terminal of another butler matrix adjacent to the one butler matrix is connected to an output port of the amplifier.

Figure 6:
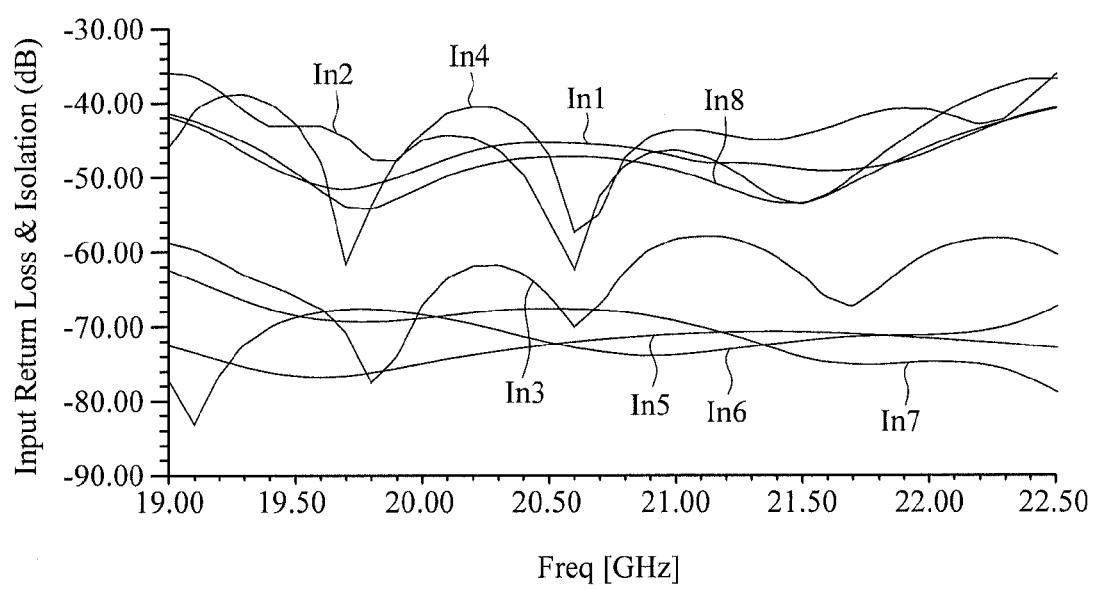
FIG. 6 shows the input return and isolation characteristics at input ports of first to fourth hybrids when an input signal is fed to the first hybrid in the butler matrix of FIG. 5.
Figure 7:
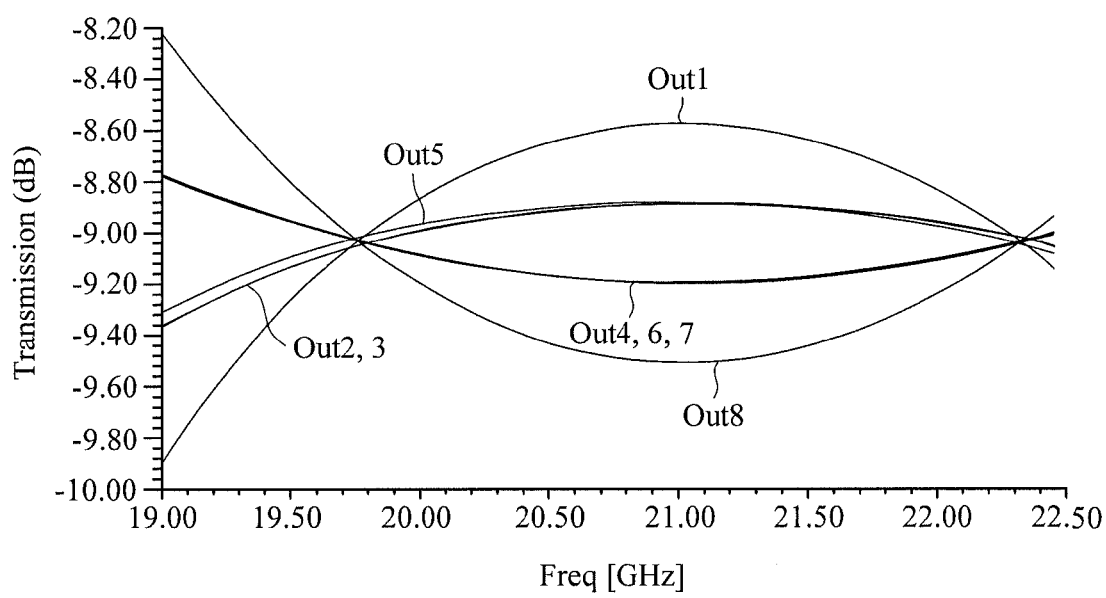
FIG. 7 shows the transmission characteristics at output ports of ninth to twelfth hybrids when an input signal is fed to the first hybrid in the butler matrix of FIG. 5.

FIG. 6 shows the input return and isolation characteristics at input ports of the first to fourth hybrids HYB1 to HYB4 when an input signal is fed to the first hybrid HYB1 in the butler matrix of FIG. 5. FIG. 7 shows the transmission characteristics at output ports of the ninth to twelfth hybrids HYB9 to HYB12 when an input signal is fed to the first hybrid HYB1 in the butler matrix of FIG. 5. In this case, a WR42 standard waveguide is used to establish a connection between the hybrids and is provided in a rectangular shape. The WR42 has an internal dimension of 10.7 mm×4.3 mm, and has a usable frequency of 18 to 26.5 GHz.

In FIG. 6, when an input signal is fed to the hybrid HYB1, the characteristics of input return and isolation at input ports In1 to In 8 of the first to fourth hybrids HYB1 to HYB4 are as follows. As shown in FIG. 6, the input return and isolation at a frequency band of about 19.5 to 22.5 GHz has a level of −35 dB or below, showing a superior result.

As shown in FIG. 7, when an input signal is fed to the first hybrid HYB1, the transmission characteristics at the output ports Out 1 to Out 8 of the ninth to twelfth HYB9 to HYB12 is as follows. In FIG. 7, the transmission at a frequency band of about 19.5 to 22.5 GHz has a level of −9±0.5 dB.

In consideration that an input is divided into outputs each having a level which is reduced by −9 dB as compared with the input power level, when there is no path loss and phase difference, FIG. 7 shows a superior result.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A butler matrix comprising a plurality of hybrids, each provided at one side thereof with an input port and at an opposite side thereof with an output port, and waveguides configured to connect the hybrids to transmit a signal among the hybrids,
   wherein the hybrids are provided in a predetermined disposition, the input port and the output port of the hybrids are provided in a predetermined direction and the waveguides are provided in a bended structure such that paths for connecting the hybrids have no crossing portion.

2. The butler matrix of claim 1, wherein the hybrid is a four port hybrid having two input ports and two output ports.

3. The butler matrix of claim 2, wherein the hybrid is a 3dB hybrid.

4. The butler matrix of claim 2, wherein the butler matrix is provided in a 4×4 butler matrix structure including four of the hybrids, and
   wherein the four hybrids are arranged in a radial shape on a same plane and include one pair of facing hybrids each having input ports directed outward and another pair of facing hybrids each having output ports directed outward.

5. The butler matrix of claim 4, wherein the butler matrix includes four of the waveguides and the four waveguides have an identical transmission length.

6. The butler matrix of claim 5, wherein the hybrid is a binomial slot hybrid having an E-plane shape.

7. The butler matrix of claim 6, wherein the waveguide is an E-plane waveguide.

8. The butler matrix of claim 2, wherein the butler matrix is provided in a 8×8 butler matrix structure including twelve of the hybrids,
wherein the twelve hybrids includes a first hybrid array, a second hybrid array and a third hybrid array, in which first four hybrids of the twelve hybrids forming the first hybrid array are arranged in a radial shape on a same plane and include one pair of facing hybrids each having input ports directed outward and another pair of facing hybrids each having output ports directed outward;
second four hybrids of the twelve hybrids forming the second hybrid array are disposed at a lower part of the first hybrid array in an identical shape of the first hybrid array; and
third four hybrid of the twelve hybrids forming the third hybrid array are disposed between the first hybrid array and the second hybrid array in parallel to the hybrids having the outward directed input ports of the first and second hybrid arrays while having output ports directed outward.

9. The butler matrix of claim 8, wherein the waveguides include first waveguides configured to connect the hybrids of the first hybrid array to each other and connect the hybrids of the second hybrid array to each other, and second waveguides configured to connect the hybrid of the first hybrid array to the hybrid of the third hybrid and connect the hybrid of the second hybrid array to the hybrid of the third hybrid.

10. The butler matrix of claim 9, wherein the first waveguides include eight waveguides and the eight waveguides have an identical transmission length.

11. The butler matrix of claim 10, wherein the second waveguides include eight waveguides and the eight waveguides have an identical transmission length.

12. The butler matrix of claim 11, wherein the hybrid is a binomial slot hybrid having an E-plane shape.

13. The butler matrix of claim 12, wherein the first waveguide is an E-plane waveguide.

14. The butler matrix of claim 12, wherein the second waveguide is implemented in a form including an E-plane waveguide and an H-plane waveguide that are connected to each other.

15. A multi-port amplifier having a butler matrix comprising: a plurality of hybrids, each provided at one side thereof with an input port and at an opposite side thereof with an output port; and waveguides configured to connect the hybrids to transmit a signal among the hybrids, wherein the hybrids are provided in a predetermined disposition, the input port and the output port of the hybrids are provided in a predetermined direction and the waveguides are provided in a bended structure such that paths for connecting the hybrids have no crossing portion.

16. The multi-port amplifier of claim 15, wherein the hybrid is a four port hybrid having two input ports and two output ports, and
the butler matrix is provided in a 4×4 butler matrix structure including four of the hybrids, and
wherein the four hybrids are arranged in a radial shape on a same plane and include one pair of facing hybrids each having input ports directed outward and another pair of facing hybrids each having output ports directed outward.

17. The multi-port amplifier of claim 16, wherein the butler matrix includes four of the waveguides and the four waveguides have an identical transmission length.

18. The multi-port amplifier of claim 15, wherein the hybrid is a four port hybrid having two input ports and two output ports, and
the butler matrix is provided in a 8×8 butler matrix structure including twelve of the hybrids,
wherein the twelve hybrids includes a first hybrid array, a second hybrid array and a third hybrid array, in which first four hybrids of the twelve hybrids forming the first hybrid array are arranged in a radial shape on a same plane and include one pair of facing hybrids each having input ports directed outward and another pair of facing hybrids each having output ports directed outward;
second four hybrids of the twelve hybrids forming the second hybrid array are disposed at a lower part of the first hybrid array in an identical shape of the first hybrid array; and
third four hybrid of the twelve hybrids forming the third hybrid array are disposed between the first hybrid array and the second hybrid array in parallel to the hybrids having the outward-directed input ports of the first and second hybrid arrays while having output ports directed outward.

19. The multi-port amplifier of claim 18, wherein the waveguides include first waveguides configured to connect the hybrids of the first hybrid array to each other and connect the hybrids of the second hybrid array to each other, and second waveguides configured to connect the hybrid of the first hybrid array to the hybrid of the third hybrid and connect the hybrid of the second hybrid array to the hybrid of the third hybrid.

20. The multi-port amplifier of claim 19, wherein the first waveguides include eight waveguides and the eight waveguides have an identical transmission length, and the second waveguides include eight waveguides and the eight waveguides have an identical transmission length.

* * * * *